(12) United States Patent
Li et al.

(10) Patent No.: US 7,637,310 B2
(45) Date of Patent: Dec. 29, 2009

(54) HEAT DISSIPATION DEVICE WITH FIXTURES FOR ATTACHMENT OF A FAN

(75) Inventors: Dong-Yun Li, Shenzhen (CN); Min Li, Shenzhen (CN); Wu-Jiang Ma, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 403 days.

(21) Appl. No.: 11/626,182

(22) Filed: Jan. 23, 2007

(65) Prior Publication Data

US 2008/0156458 A1    Jul. 3, 2008

(30) Foreign Application Priority Data

Dec. 29, 2006    (CN)    ......................... 2006 1 0064583

(51) Int. Cl.
*F28F 7/00*    (2006.01)
*H05K 7/20*    (2006.01)

(52) U.S. Cl. ...................... 165/80.3; 165/67; 361/697

(58) Field of Classification Search ............... 165/67, 165/69, 76, 80.3, 185, 121, 104.34; 361/695, 361/697, 702, 703, 704, 709, 719; 24/453, 24/457, 458; 248/500, 509, 510
See application file for complete search history.

(56) References Cited

U.S. PATENT DOCUMENTS

| 6,392,889 | B1 * | 5/2002 | Lee et al. ..................... 361/704 |
| 6,497,273 | B1 * | 12/2002 | Horng et al. ............... 165/80.3 |
| 6,654,246 | B2 | 11/2003 | Wu |
| 6,667,884 | B1 * | 12/2003 | Lee et al. ..................... 361/697 |
| 7,099,156 | B2 * | 8/2006 | Chen et al. ................... 361/719 |
| 7,289,330 | B2 * | 10/2007 | Lu et al. ..................... 361/710 |
| 7,480,144 | B2 * | 1/2009 | Li ............................. 361/704 |
| 7,493,940 | B2 * | 2/2009 | Chen et al. .................. 165/121 |

* cited by examiner

*Primary Examiner*—Tho v Duong
(74) *Attorney, Agent, or Firm*—Frank R. Niranjan

(57) ABSTRACT

A heat dissipation device includes a heat sink (10) and a fan (30) mounted on the heat sink via a pair of fan holders (20) and clips (40). The fan holders each have a supporting plate (24) attached on the heat sink and a sleeve (26) connected to the supporting plate and spaced from the supporting plate. The fan has upper and lower flanges (32, 34). The lower flange is sandwiched between the sleeve and the supporting plate. The clips each include a shaft (42) extending through the sleeve, a spring (44) mounted around and received in sleeve, and a handle (46) pivotably mounted on the shaft and movable between unlocked and locked positions. When the handle is positioned at the locked position, the shaft is inserted in the lower flange of the fan to thereby secure the fan on the heat sink.

15 Claims, 11 Drawing Sheets

HEAT DISSIPATION DEVICE WITH FIXTURES FOR ATTACHMENT OF A FAN

BACKGROUND OF THE INVENTION

1. Field of the Invention

The present invention relates generally to a heat dissipation device, and more particularly to a heat dissipation device with fixtures for attachment of a fan.

2. Description of Related Art

It is well known that during operation, computer electronic devices such as central processing units (CPU) can generate large amounts of heat. The heat must be quickly removed from the electronic device to prevent it from becoming unstable or being damaged. Typically, a heat sink is attached to an outer surface of the electronic device to absorb heat from the electronic device, and the heat absorbed by the heat sink is then dissipated to ambient air.

Generally, in order to improve heat dissipation efficiency of a heat sink, a fan is used to provide forced airflow to the heat sink. Usually, the fan comprises a frame having upper and lower retaining flanges extending outwards from two opposite ends of each corner thereof, and is mounted to the heat sink via a fan holder. Conventionally, the heat sink mainly comprises a heat-conducting base for contacting a heat generating electronic device and a plurality of heat dissipating fins extending from a top surface of the base. Typically, the fan is secured on the fan holder by a plurality of elongated screws, which each has a head and a shaft extending axially from the head. The fan defines a fixing hole in each retaining flange corresponding to the screw. To attach the fan to the heat sink, the shafts of screws extend through the fixing holes of the fan to engage with the fan holder, whilst the heads of the screws rest on the upper retaining flanges. In this way, the fan is firmly sandwiched between the heads of the screws and the fan holder. U.S. Pat. No. 6,654,246 shows an example of a heat sink attached with a fan which is secured to the heat sink through a fan holder and a plurality of elongated screws in a manner as mentioned above. However, assembly and disassembly of the heat sink and the fan is awkward and time consuming.

What is needed, therefore, is a heat dissipation device having fixtures for attachment of a fan, which overcomes the above-mentioned problems.

SUMMARY OF THE INVENTION

A heat dissipation device in accordance with a preferred embodiment of the present invention comprises a heat sink and a fan mounted on the heat sink via a pair of fan holders and clips. The fan holders each have a supporting plate attached on the heat sink and a sleeve connected to the supporting plate and spaced from the supporting plate. The fan has upper and lower flanges. The lower flange is sandwiched between the sleeve and the supporting plate. The clips each include a shaft extending through the sleeve, a spring mounted around and received in sleeve, and a handle pivotably mounted on the shaft and movable between unlocked and locked positions. When the handle is positioned at the locked position, the shaft is inserted in the lower flange of the fan to thereby secure the fan on the heat sink.

Other advantages and novel features will become more apparent from the following detailed description of preferred embodiments when taken in conjunction with the accompanying drawings, in which:

BRIEF DESCRIPTION OF THE DRAWINGS

Many aspects of the present apparatus and method can be better understood with reference to the following drawings. The components in the drawings are not necessarily drawn to scale, the emphasis instead being placed upon clearly illustrating the principles of the present apparatus and method. Moreover, in the drawings, like reference numerals designate corresponding parts throughout the several views.

DETAILED DESCRIPTION OF THE INVENTION

Figure 1:
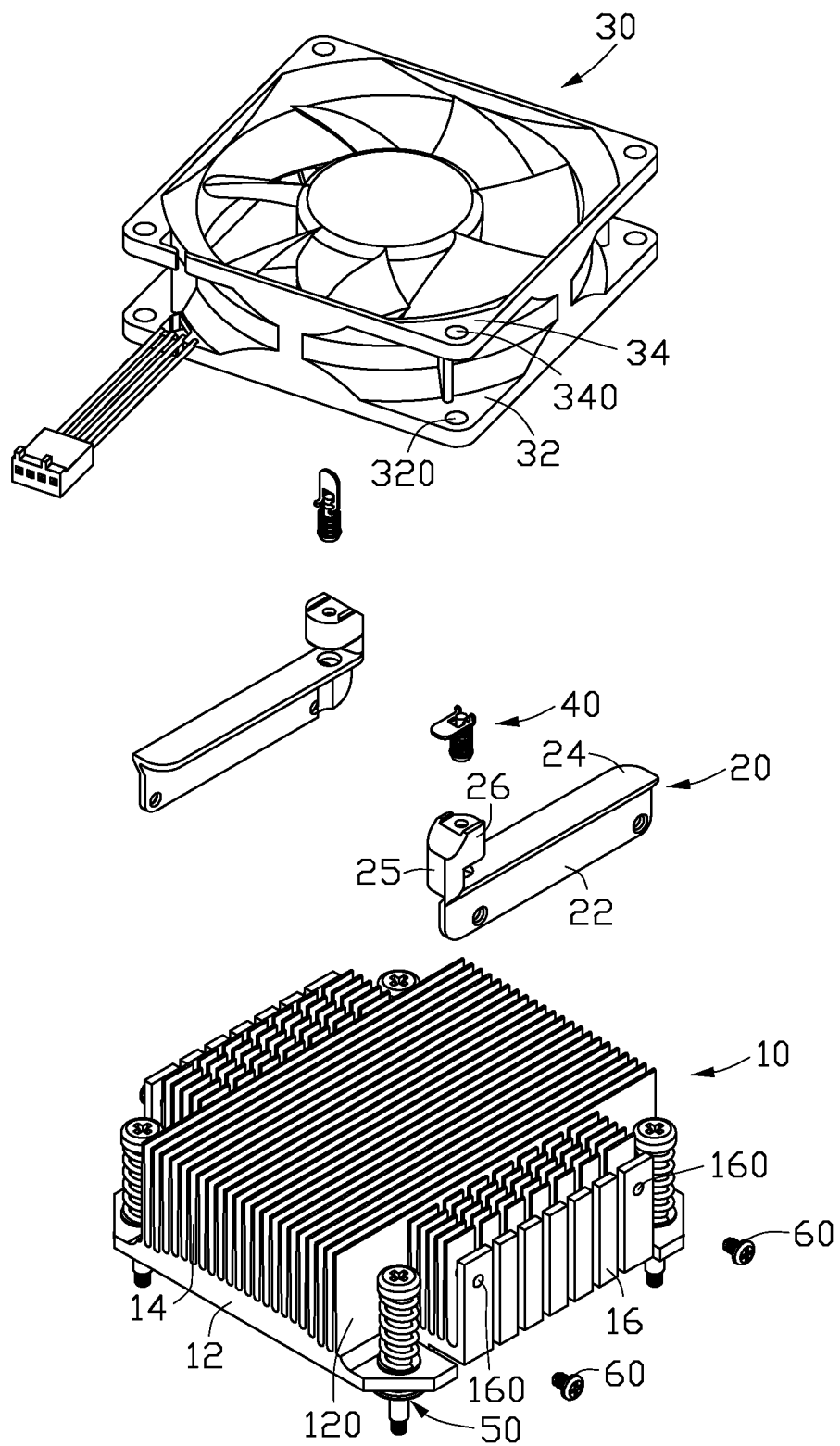
FIG. 1 is an exploded, isometric view of a heat dissipation device in accordance with a preferred embodiment of the present invention.
Figure 9:
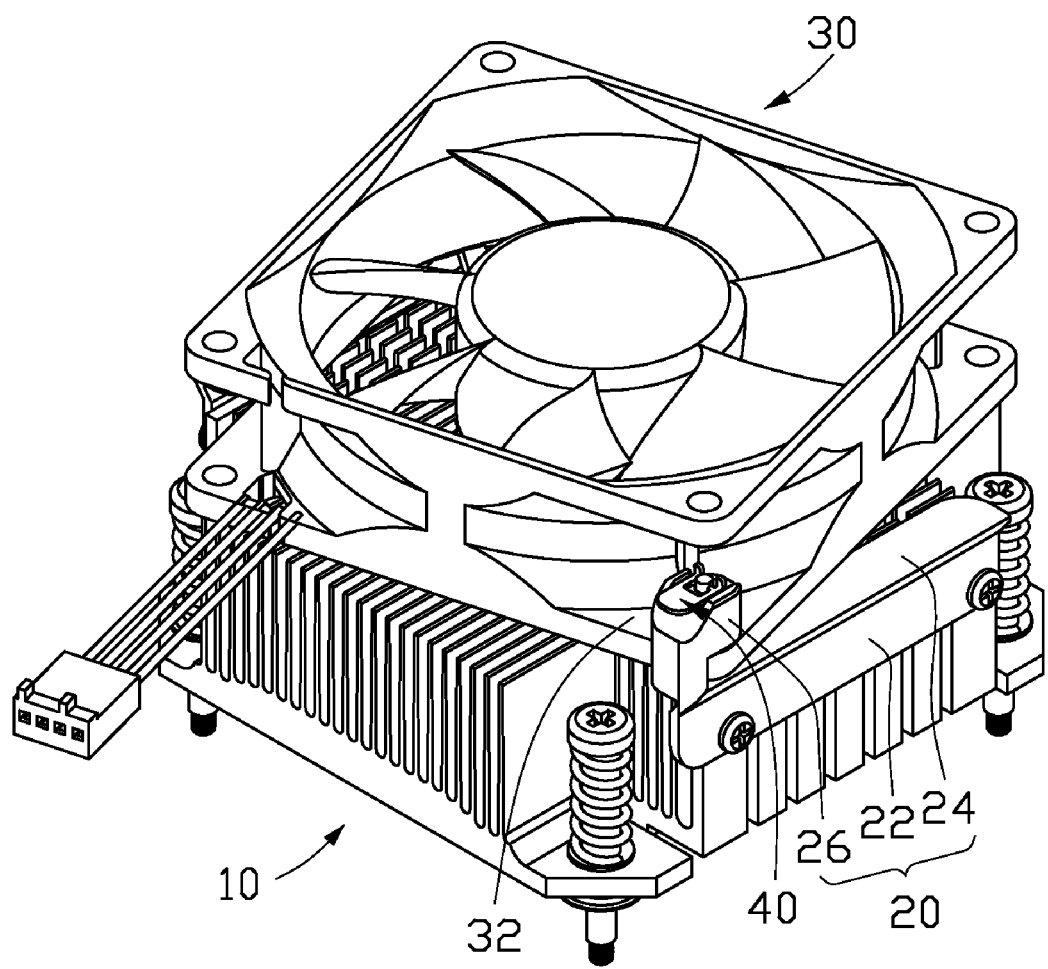
FIG. 9 is an assembled view of FIG. 1 with the clip in the locked position.

FIG. 1 and FIG. 9 illustrate a heat dissipation device in accordance with a preferred embodiment of the present invention. The heat dissipation device comprises a heat sink 10, a pair of fan holders 20 mounted on two opposite lateral sides of the heat sink 10, a fan 30 and a pair of clips 40 cooperating with the fan holders 20 for securing the fan 30 on the heat sink 10.

The heat sink 10 is integrally extruded from a heat conductive material, such as aluminium, and comprises a base 12 and a plurality of parallel fins 14, 16 perpendicularly and upwardly extending from the base 12. The base 12 has a bottom face for contacting a heat-generating electronic component such as a CPU (not shown). The fins 16 are of shorter length than the fins 14 and are located at central portions of opposite lateral sides of the fins 14 such that four receiving spaces 120 are formed at four corners of the heat sink 10. Four fasteners 50 extend through the base 12 at the receiving spaces 120 respectively to mount the heat sink 10 on a printed circuit board (not shown). Each fin 16 having several slots (not labeled) formed therein, is slightly lower than that of the fins 14 for mounting the fan holders 20 thereon. Two opposite outmost fins 16 each define a pair of threaded holes 160 therein for providing passage of screws 60 to mount the fan holders 20 on the heat sink 10.

Figure 2:
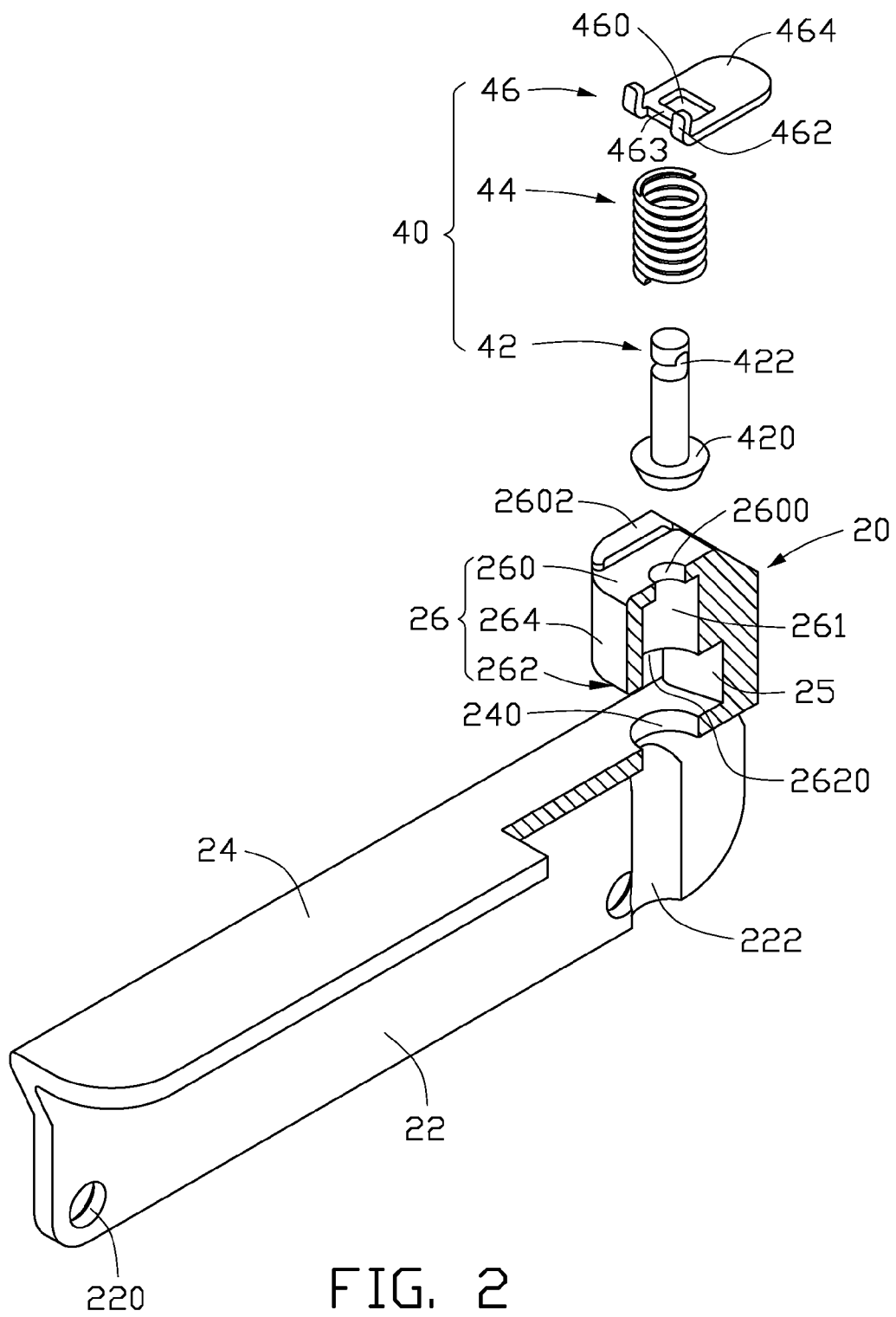
FIG. 2 is an exploded, isometric view of a fan holder and a clip from FIG. 1, wherein the fan holder has a part being removed to clearly show an inner structure thereof.
Figure 3:
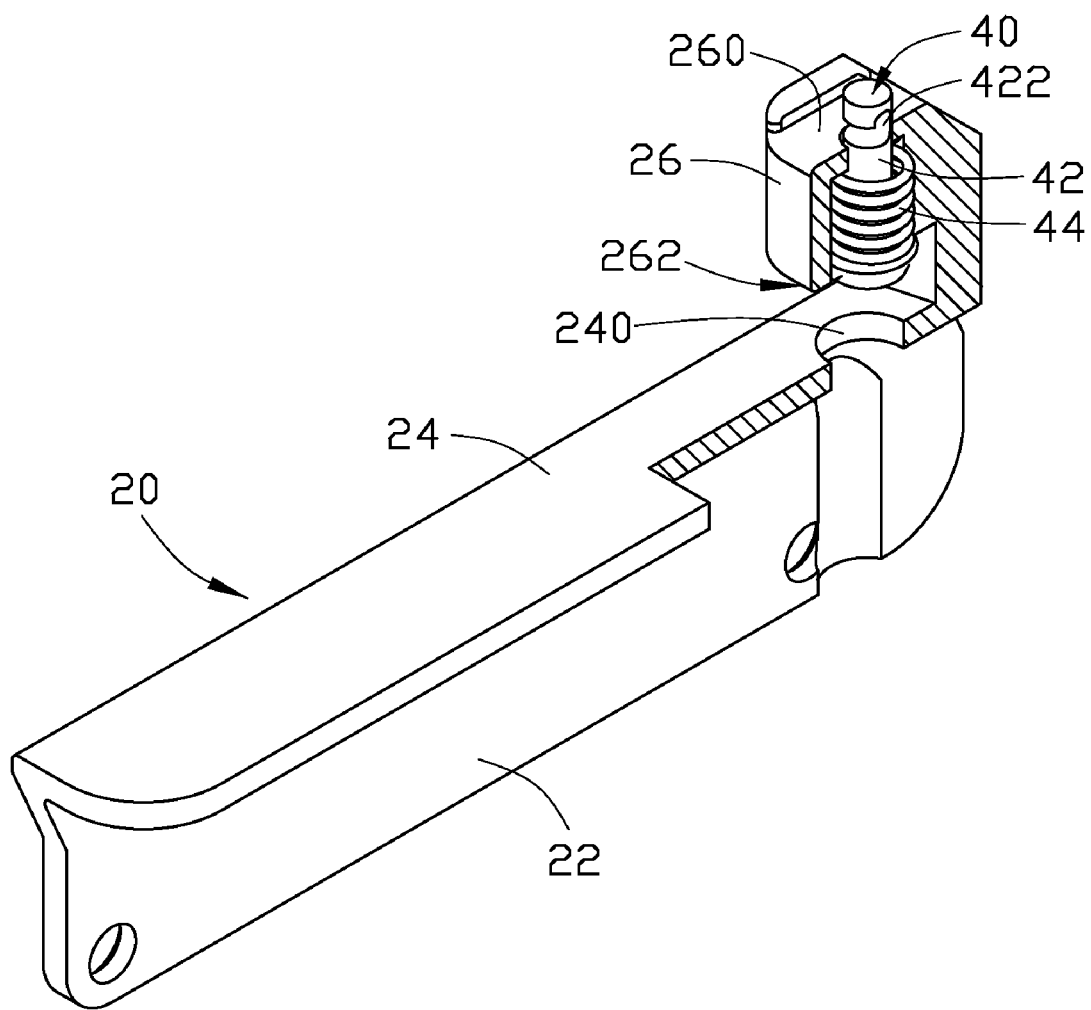
FIG. 3 is an assembled view of FIG. 2 with a handle of the clip omitted.
Figure 4:
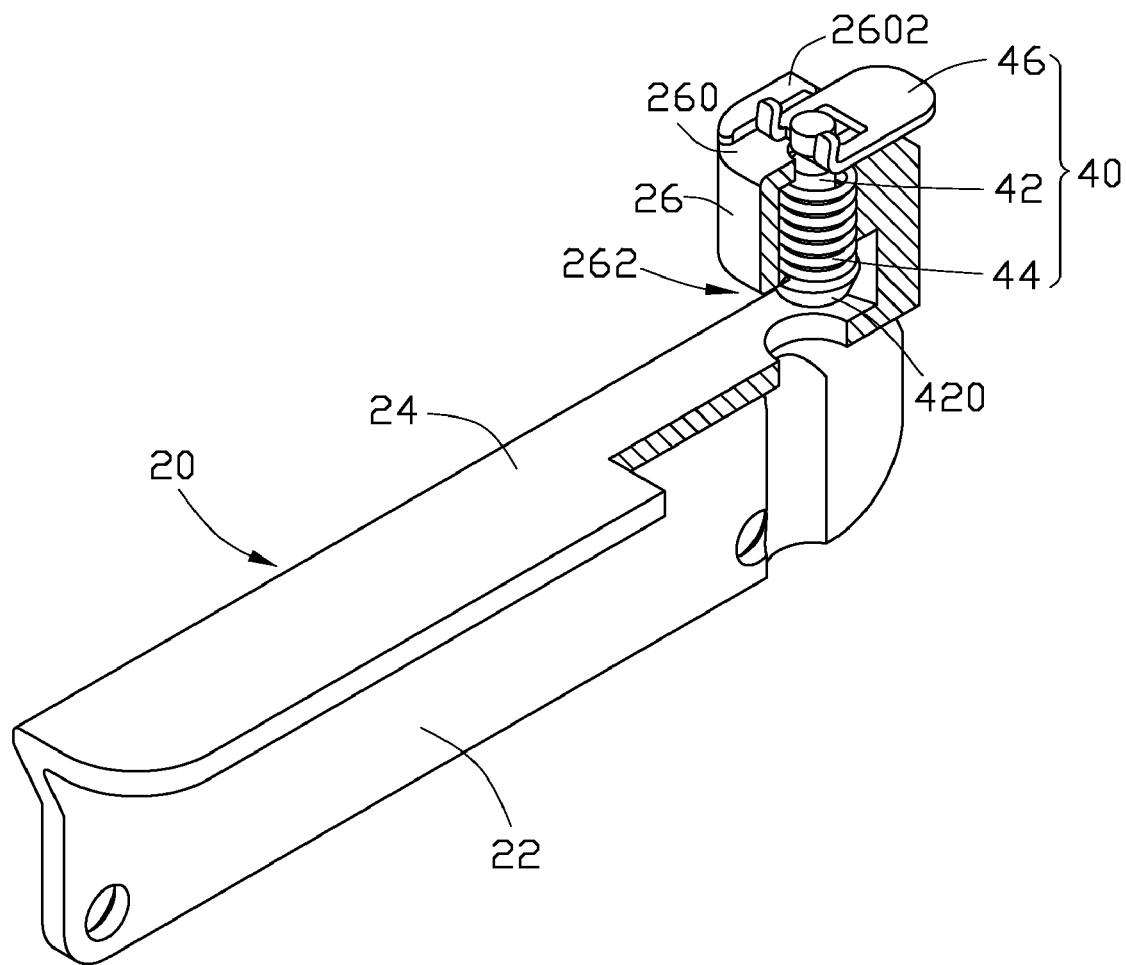
FIG. 4 is an assembled view of FIG. 2 with the clip in a locked position.

Also referring to FIG. 2, each fan holder 20 comprises a vertical mounting plate 22 attached to the lateral side of the outmost fin 16, a horizontal supporting plate 24 attached on a top of the fins 16 and a sleeve 26 located above the supporting plate 24. The mounting plate 22 defines a pair of fixing holes 220 corresponding to the threaded holes 160 of the fin 16, for engagingly receiving the screws 60 therein to secure the fan holder 20 on the fin 16. The mounting plate 22 is firstly bent outwards from a top edge thereof, then bent inwards and horizontally to form the supporting plate 24. A flexible connection between the mounting plate 22 and the supporting plate 24 provides the supporting plate 24 with cushioning. A connecting plate 25 extends upwardly from a free end of the supporting plate 24 and connects the sleeve 26 and the supporting plate 24. The sleeve 26 has top and bottom portions 260, 262, and an arced circumference wall 264 connecting the top and bottom portions 260, 262. The sleeve 26 has a cylindrical inner surface to define a receiving space 261 therein. The bottom portion 262 of the sleeve 26 is parallel to and spaced from the supporting plate 24. The bottom portion 262 defines a bottom hole 2620 therein communicating with the receiving space 261. The bottom hole 2620 has the same inner diameter as that of the receiving space 261. The top portion 260 of the sleeve 26 is parallel to the bottom portion 262 and defines a top hole 2600 therein communicating with the receiving space 261. The top hole 2600 has an inner diameter smaller that of the bottom hole 2620 of the bottom portion 262 of the sleeve 26. A pair of blocks 2602 are formed on opposite edges of the top portion 260 of the sleeve 26. The supporting plate 24 defines a through hole 240 corresponding to the bottom hole 2620 of the bottom portion 262 of the sleeve 26. The through hole 240 of the supporting plate 24 has the same inner diameter as that of the bottom hole 2620 of the sleeve 26 for providing passage of the clip 40. The mounting plate 22 defines a slot 222 at an inner surface thereof located corresponding to the through hole 240 of the supporting plate 24 for preventing interference with the clip 40.

Each clip 40 comprises an elongated shaft 42, a spring 44 loosely fitting around the shaft 42 and a handle 46 mounted on the shaft 42. The shaft 42 has an outer diameter slightly smaller than the inner diameter of the top hole 2600 of the sleeve 26 of the fan holder 20. The shaft 42 terminates with a cone-shaped pedestal 420 having a downwardly gradually reduced outer diameter, which is larger than that of the shaft 42 for supporting the spring 44 thereon. The shaft 42 defines a transverse slot 422 adjacent to a top thereof. The handle 46 comprises a horizontal body (not labeled) and a pair of spaced engaging portions 462 perpendicularly and upwardly bent from a free end of the body. The body of the handle 46 defines a rectangular hole 460 therein adjacent to the engaging portions 462. An operating portion 464 is formed at a side the hole 460 and a bar 463 is formed at the other side of the hole 460. The engaging portions 462 are located at two opposite ends of the bar 463. The bar 436 has a length longer than the outer diameter of the shaft 42. The bar 436 is pivotably and snappingly received in the slot 422 of the shaft 42 such that the handle 46 can rotate around the bar 436 relative to the shaft 42 between locked and unlocked positions. When the body of the handle 46 is upright, the clip 40 is positioned in the unlocked position, while the body of the handle 46 is horizontal, the clip 40 is positioned in the locked position.

The fan 30 has lower and upper flanges 32, 34 extending outwards and horizontally at each corner thereof. The lower and the upper flanges 32, 34 respectively define mounting holes 320, 340 therein. Two diagonal mounting holes 320 of the fan 30 are oriented to be in alignment with the bottom holes 2620 of the sleeves 26 and the through holes 240 of the supporting plates 24 of the fan holders 20 when the fan 30 is brought to be mounted to the fan holders 20 on the heat sink 10. Each lower flange 32 is of a thickness essentially equal to a perpendicular distance between the bottom portion 262 of the sleeve 26 and the supporting plate 24 of the fan holder 20, thus allowing the corresponding lower flange 32 of the fan 30 to be mounted between the bottom portion 262 of the sleeve 26 and the supporting plate 24 of the fan holder 20.

Figure 5:
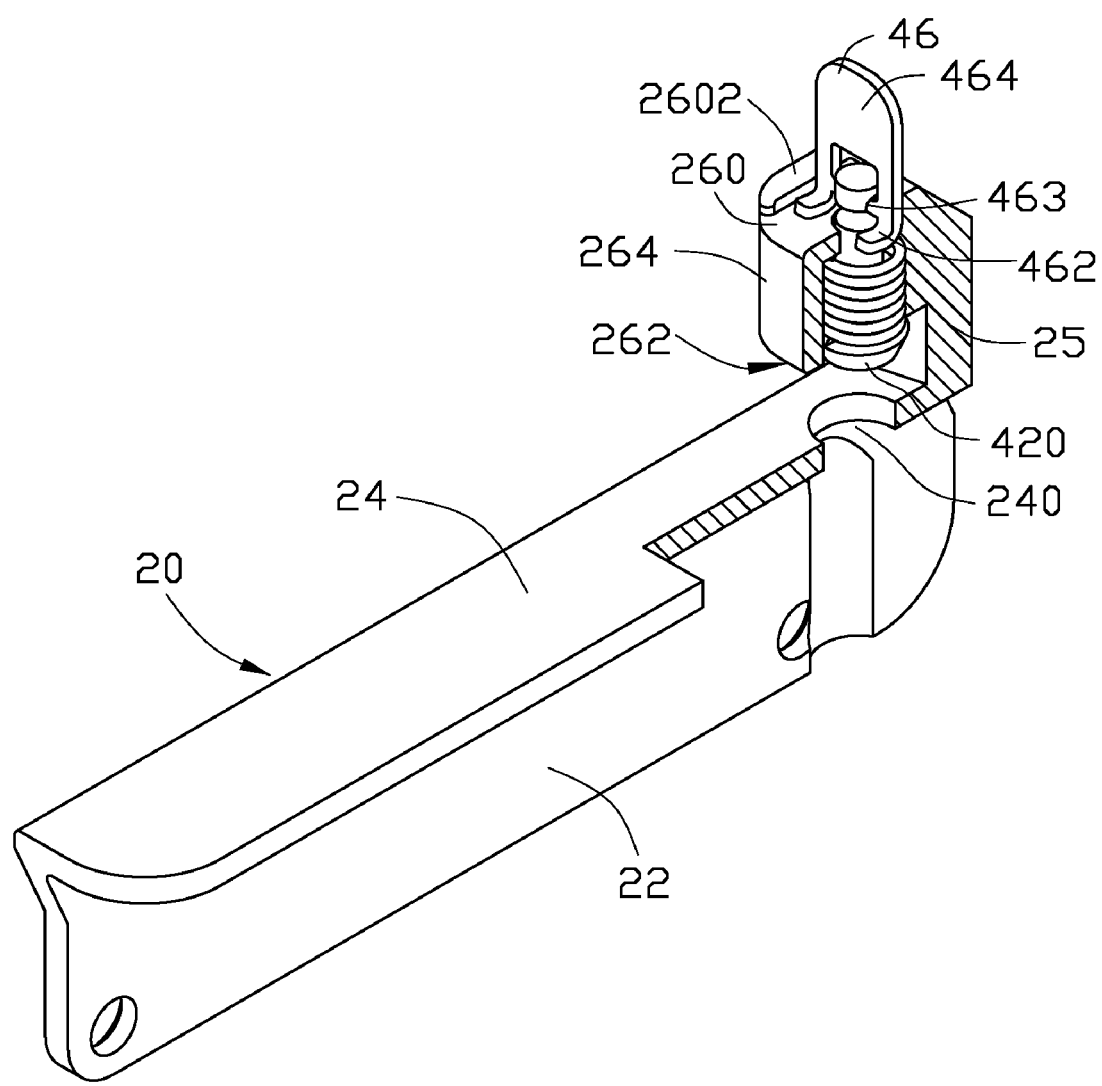
FIG. 5 is an assembled view of FIG. 2 with the clip in an unlocked position.
Figure 6:
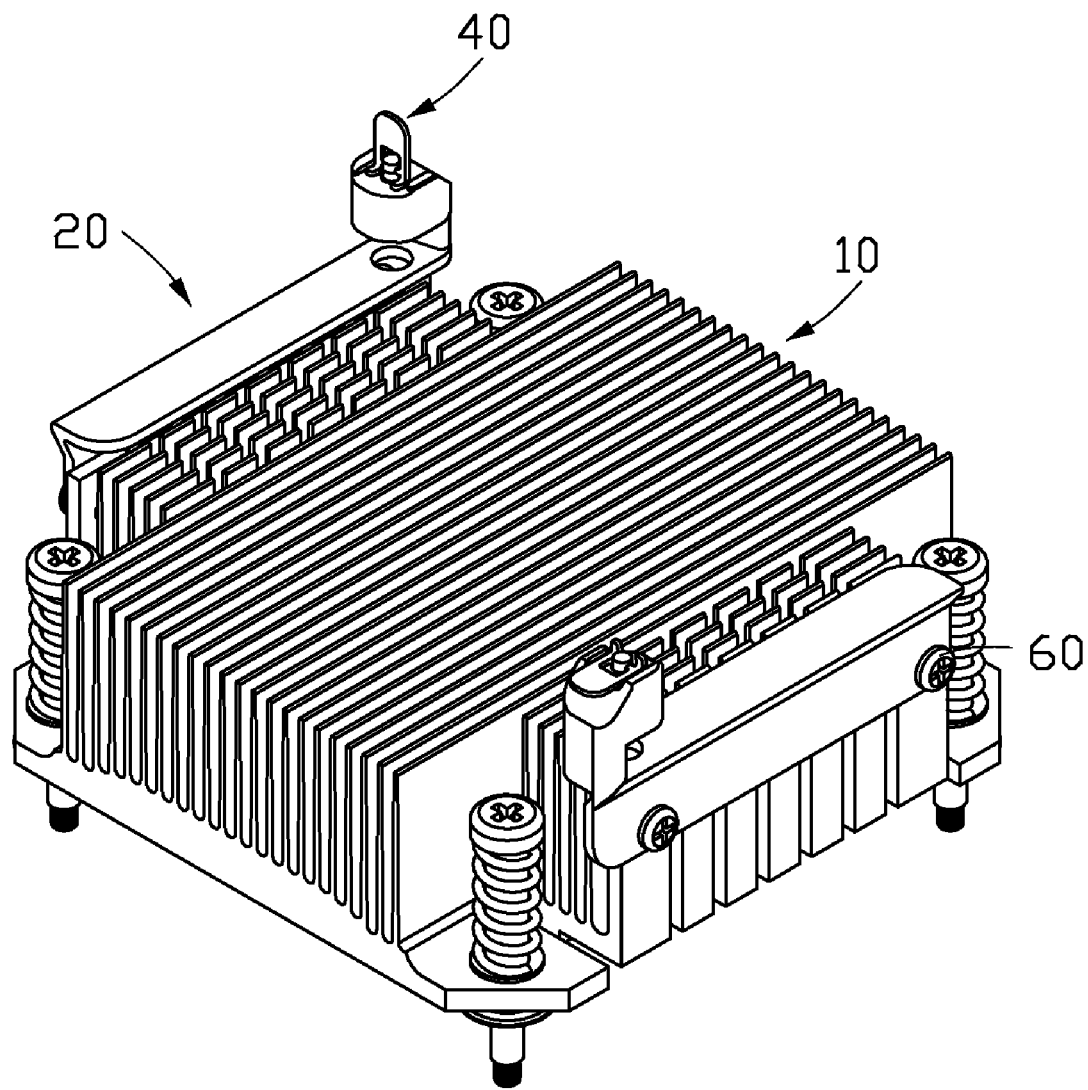
FIG. 6 is an assembled view of a heat sink, the fan holder and the clip of FIG. 1.
Figure 7:
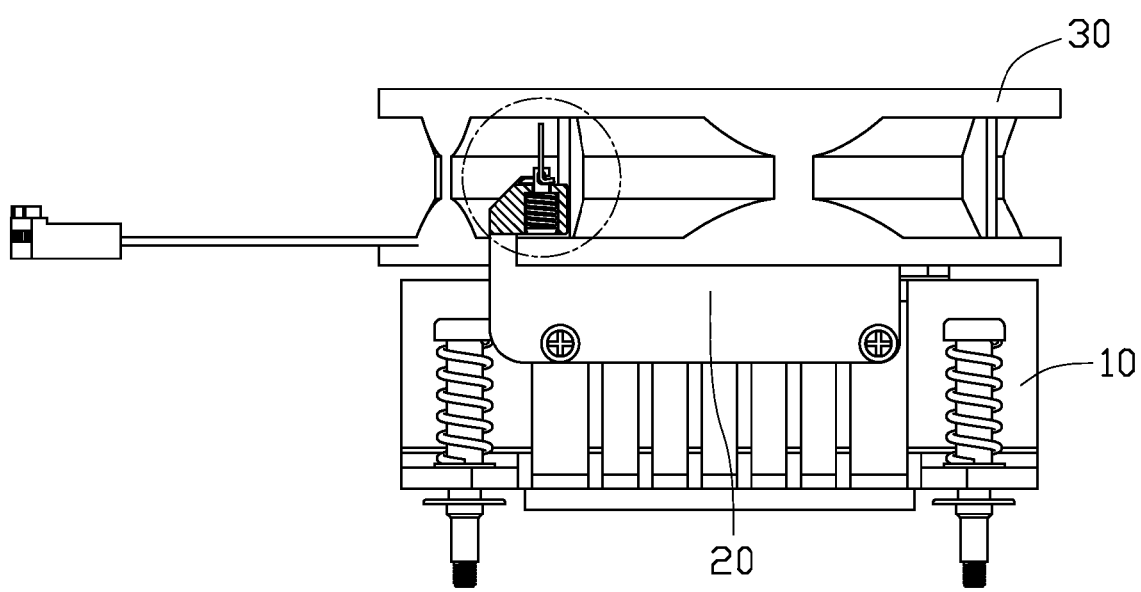
FIG. 7 is an assembled and side view of FIG. 1 with the clip in the unlocked position.
Figure 7A:
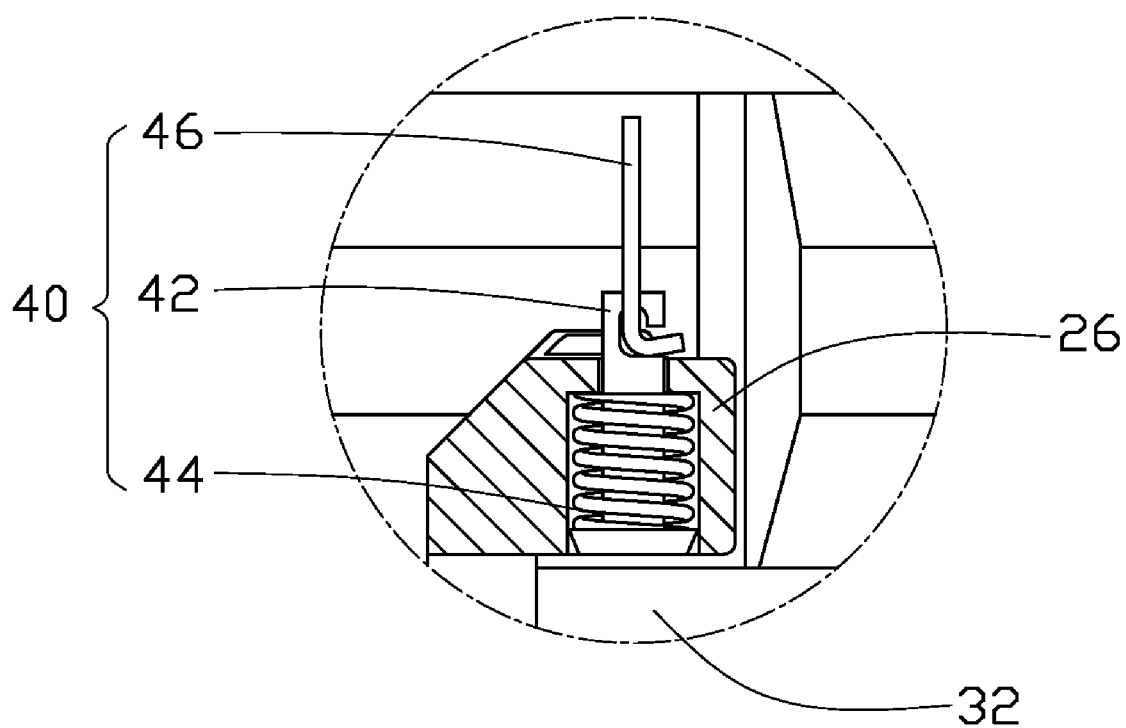
FIG. 7A is an enlarged view of a circled portion of FIG. 7.
Figure 8:
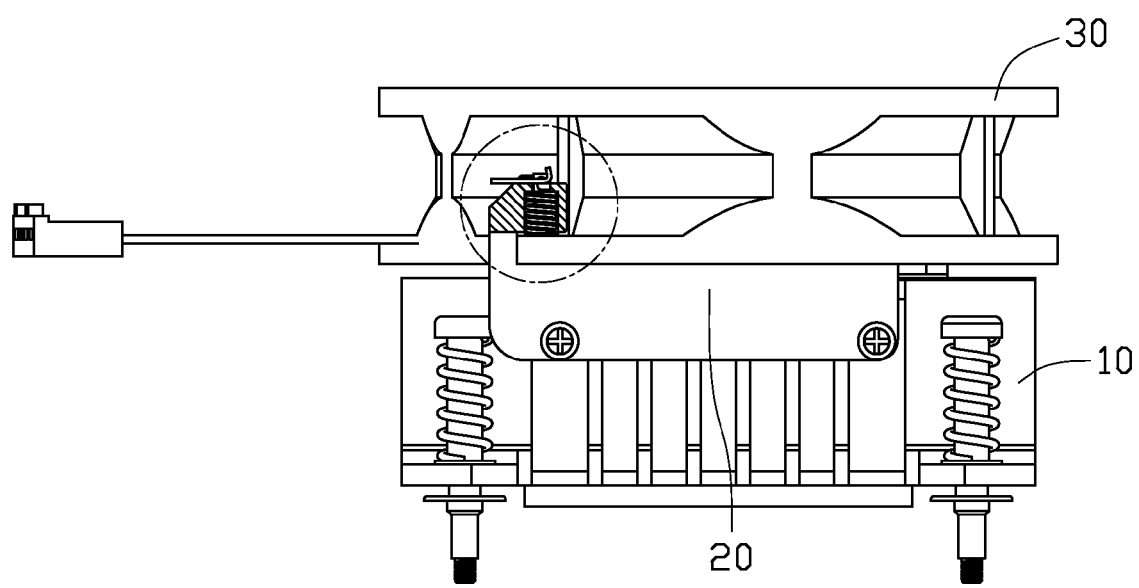
FIG. 8 is an assembled and side view of FIG. 1 with the clip in the locked position.
Figure 8A:
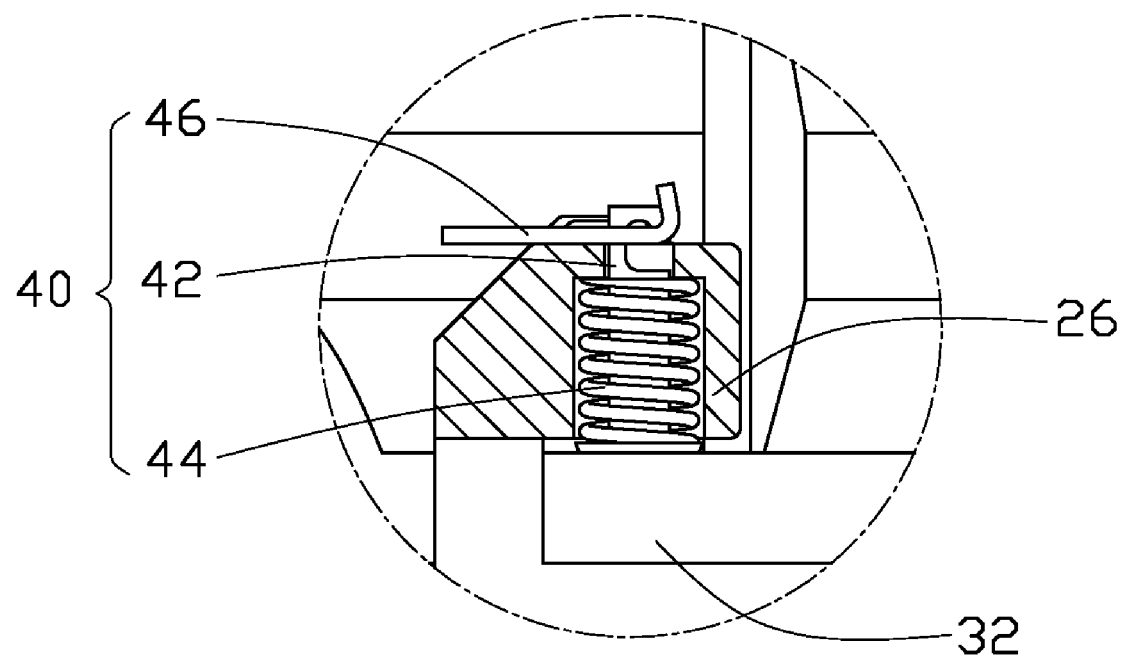
FIG. 8A is an enlarged view of a circled portion of FIG. 8.

Referring to FIGS. 3-7A, in assembly of the heat dissipation device of the present invention, the shaft 42 of each clip 40 with the spring 44 is extended through the through hole 240 of the supporting plate 24 of the fan holder 20, the bottom hole 2620 of the bottom portion 262 of the sleeve 26, the receiving space 261 of the sleeve 26, the top hole 2600 of the top portion 260 of the sleeve 26 in series along a bottom-top direction. The top portion of the shaft 42 of the clip 40 is raised upwardly in a manner such that the slot 422 of the shaft 42 is located beyond the top portion 260 of the sleeve 26 of the fan holder 20 and arrives at a position shown in FIG. 3. The bar 463 of the handle 46 is then engaged in the slot 422 of the shaft 42 in a manner such that the handle 46 is located between the two blocks 2602 of the sleeve 26 and mounted on the shaft 42. The body of the handle 46 of the clip 40 abuts against the top portion 260 of the sleeve 26 and arrives at a position shown in FIG. 4; simultaneously, the clip 40 drops a distance in a manner such that the pedestal 420 of the clip 40 is located beyond the bottom portion 262 of the sleeve 26, and the spring 44 is compressed between the top portion 260 of the sleeve 26 and the pedestal 420 of the shaft 42. Referring to FIG. 5, the operating portion 464 of the handle 46 is upwardly operated to rotate around the bar 463 until the engaging portions 462 of the handle 46 abut against the top portion 260 of the sleeve 26. In this position, the body of the handle 46 arrives at a vertical plane perpendicular to the engaging portions 462 and the bar 463 is raised a distance relative to the top portion 260 of the sleeve 26; simultaneously, the shaft 42 is also raised the same distance as that of the bar 463. A bottom of the pedestal 420 of the clip 40 is aligned with the bottom portion 262 of the sleeve 26. Thus, the clip 40 and the fan holder 20 are assembled together with the clip 40 moving from a lower, locked position (FIG. 4) to an upper, unlocked position (FIG. 5). Referring to FIG. 6, a combination of each clip 40 and each fan holder 20 is mounted on lateral sides of the heat sink 10 via the screws 60. The sleeves 26 and clips 40 are located at the diagonal of the heat sink 10. Referring to FIGS. 7-9, the fan 30 is placed on the supporting plates 24 of the two opposite fan holders 20 mounted on the fins 16 of the heat sink 10 in the diagonal manner. The diagonal lower flanges 32 are mounted on the supporting plates 24 of the fan holders 20. The diagonal mounting holes 320 of the lower flanges 32 are in alignment with the bottom holes 2620 of the sleeves 26 and the through holes 240 of the supporting plates 24 of the fan holders 20. The operating portion 464 of the handle 46 of each clip 40 is rotated downwardly around the bar 463 until the body of the handle 46 abuts against the top portion 260 of the sleeve 26. When the body of the handle 42 is positioned in a horizontal plane, the shaft 42 drops a distance with the bar 463 of the body in a manner such that the pedestal 420 is snappingly inserted into the mounting hole 320 of the lower flange 32 of the fan 30; thus, the fan 30 is securely mounted on the supporting plates 24. Referring to FIG. 9, the two diagonal lower flanges 32 are tightly sandwiched between the sleeves 26 and the supporting plates 24 of the fan holders 20. The fan 30 is thus firmly secured on the heat sink 10.

The fan 30 is conveniently detached from the fan holders 20 by lifting the handles 46 of the clips 40 to drive the pedestals 420 of the shafts 42 of the clips 40 to be raised and disengaged from the fan 30. The fan 30 can easily be removed from the fan holders 20.

It is believed that the present embodiments and their advantages will be understood from the foregoing description, and it will be apparent that various changes may be made thereto without departing from the spirit and scope of the invention or sacrificing all of its material advantages, the examples hereto described merely being preferred or exemplary embodiments of the invention.

What is claimed is:

1. A fixture adapted for attaching a fan to a heat sink, the fan having lower and upper flanges, the fixture comprising:
   a fan holder comprising a supporting plate mounted on the heat sink and a sleeve connected to and located above the supporting plate, the lower flange of the fan sandwiched between the supporting plate and a bottom portion of the sleeve; and
   a clip comprising a shaft, a spring mounted around the shaft and a handle pivotably mounted on the shaft and movable between locked and unlocked positions, and the shaft and the spring are received in the sleeve of the fan holder, and the handle located above a top portion of the sleeve;
   wherein when the handle of the clip rotates from the unlocked position to the locked position, a bottom portion of the shaft moves downwardly and is snappingly inserted into a hole of the lower flange of the fan to thereby secure the fan on the heat sink.

2. The fixture as claimed in claim 1, wherein the fan holder further comprises a mounting plate mounted at a lateral side of the heat sink, and the supporting plate of the fan holder is perpendicularly bent from the mounting plate.

3. The fixture as claimed in claim 2, wherein an end of the shaft of the clip has a pedestal having an outer diameter larger than that of the shaft attached thereon, and the spring is compressed between the top portion of the sleeve and the pedestal of the shaft.

4. The fixture as claimed in claim 3, wherein the outer diameter of the pedestal of the clip is gradually reduced along a top-to-bottom direction thereof.

5. The fixture as claimed in claim 4, wherein the handle of the clip comprises a body and an engaging portion formed on an end of the body and perpendicular to the body.

6. The fixture as claimed in claim 5, wherein when the handle is positioned in the locked position, the body is horizontal and abuts against the top portion of the sleeve and the engaging portion is upright; while the handle is positioned in the unlocked position, the engaging portion is horizontal and abuts against the top portion of the sleeve, the body is upright and the shaft is raised a distance from the supporting plate of the fan holder in relative to the locked position.

7. The fixture as claimed in claim 5, wherein a pair of blocks are formed on the top portion of the sleeve, and the body of the handle is sandwiched between the blocks when the clip is positioned at the locked position.

8. A heat dissipation device comprising:
   a heat sink comprising a base and a plurality of fins arranged on the base;
   a pair of fan holders each having a supporting plate mounted on a top of the heat sink and a sleeve connected to the supporting plate and spaced from the supporting plate;
   a fan comprising a frame which has upper and lower flanges, the lower flange is sandwiched between the sleeve and the supporting plate; and
   a pair of clips each comprising a shaft extending through the sleeve, a spring mounted around the shaft and received in the sleeve, and a handle pivotably connected to the shaft and located above a top portion of the sleeve and movable between unlocked and locked positions;
   wherein when the handle is positioned at the locked position, the shaft is inserted into a hole the lower flange of the fan to thereby secure the fan on the heat sink.

9. The heat dissipation device as claimed in claim 8, wherein the fan holders further comprise a pair of vertical mounting plates mounted on lateral sides of the heat sink, and the supporting plates of the fan holders are bent perpendicularly from the mounting plates.

10. The heat dissipation device as claimed in claim 8, wherein the sleeves are located at a diagonal of the heat sink.

11. The heat dissipation device as claimed in claim 8, wherein a connecting plate extends upwardly from a free end of the supporting plate and connects the sleeve and the supporting plate.

12. The heat dissipation device as claimed in claim 8, wherein the top portion and a bottom portion of the sleeve are each oriented parallel to the supporting plate of the fan handle.

13. The heat dissipation device as claimed in claim 8, wherein an end of the shaft of the clip has a pedestal having an outer diameter larger than that of the shaft attached thereon, and the spring is compressed between the top portion of the sleeve and the pedestal of the shaft.

14. The heat dissipation device as claimed in claim 13, wherein the handle comprises a body and an engaging portion formed on an end of the body and perpendicular to the body.

15. The heat dissipation device as claimed in claim 14, wherein when the handle is positioned in the locked position, the body abuts against the top portion of the sleeve and the engaging portion is upright, while the handle is positioned in the unlocked position, the engaging portion abuts against the top portion of the sleeve, the body is upright and the shaft is raised a distance from the supporting plate of the fan holder in relative to the locked position.

* * * * *